US011275117B2

(12) United States Patent
Pofahl et al.

(10) Patent No.: US 11,275,117 B2
(45) Date of Patent: Mar. 15, 2022

(54) RECURSIVE, TIME-SERIES-BASED METHOD FOR DETERMINING THE STATE OF AN ELECTROCHEMICAL REACTOR

(71) Applicant: AVL List GmbH, Graz (AT)

(72) Inventors: Stefan Pofahl, Graz (AT); Daniel Ritzberger, Vienna (AT); David Kindl, Seewalchen (AT)

(73) Assignee: AVL List GmbH, Graz (AT)

( * ) Notice: Subject to any disclaimer, the term of this patent is extended or adjusted under 35 U.S.C. 154(b) by 0 days.

(21) Appl. No.: 16/767,164

(22) PCT Filed: Nov. 27, 2018

(86) PCT No.: PCT/AT2018/060277
§ 371 (c)(1),
(2) Date: May 27, 2020

(87) PCT Pub. No.: WO2019/100096
PCT Pub. Date: May 31, 2019

(65) Prior Publication Data
US 2020/0386818 A1    Dec. 10, 2020

(30) Foreign Application Priority Data

Nov. 27, 2017  (AT) .............................. A 50983/2017

(51) Int. Cl.
*G01R 31/36*       (2020.01)
*G01R 31/382*     (2019.01)

(52) U.S. Cl.
CPC ....... *G01R 31/3648* (2013.01); *G01R 31/382* (2019.01)

(58) Field of Classification Search
CPC .................................................. G01R 31/3648
USPC .......................................................... 702/63
See application file for complete search history.

(56) References Cited

U.S. PATENT DOCUMENTS

2014/0372054 A1*  12/2014  Wang .................... G01R 31/367
                                                               702/63
2016/0139210 A1*   5/2016  Coenen .............. G01R 31/3842
                                                               702/63
2016/0259011 A1*   9/2016  Joe ...................... G01R 31/3835
2017/0254858 A1*   9/2017  Weicker ............. G01R 31/3842

* cited by examiner

Primary Examiner — Ricky Go

(57) ABSTRACT

The present invention relates to a method for determining the state of an electrochemical reactor (1), having the steps of: operating an electrode section (2) of the electrochemical reactor (1) for the purpose of generating a harmonic current and voltage signal by means of the electrode section (2), and estimating the amplitude and/or phase of the harmonic current and voltage signal in a model-based manner, wherein the state of the electrochemical reactor (1) is determined on the basis of the estimation, wherein a recursive, time-series-based method is used to estimate the amplitude and/or phase of the harmonic current and voltage signal. The invention also relates to a diagnostic system (3), to a computer program product (5) and to a storage means (6).

12 Claims, 5 Drawing Sheets

RECURSIVE, TIME-SERIES-BASED METHOD FOR DETERMINING THE STATE OF AN ELECTROCHEMICAL REACTOR

RELATED APPLICATIONS

This application is a National Phase of PCT Patent Application No. PCT/AT2018/060277 having International filing date of Nov. 27, 2018, which claims the benefit of priority of Austrian Patent Application No. A50983/2017 filed on Nov. 27, 2017. The contents of the above applications are all incorporated by reference as if fully set forth herein in their entirety.

FIELD AND BACKGROUND OF THE INVENTION

The present invention relates to a method for ascertaining the state of an electrochemical reactor. The invention further relates to a diagnostic system for ascertaining the state of a generic electrochemical reactor, a computer program product for ascertaining the state, and a storage means with a computer program product stored thereon.

The prior art has disclosed the practice of monitoring electrochemical reactors such as fuel cell systems by means of signal analysis. Here, a harmonic or periodic current and voltage signal can be applied to an electrode section at least substantially forming the electrochemical reactor, for example to a fuel cell stack of the fuel cell system, with a periodic response signal resulting therefrom subsequently being read. On the basis of the response signal, it is now possible to draw conclusions about the state of the electrochemical reactor. Such an ascertainment of the state can be understood to be a type of impedance spectroscopy.

The use of a so-called THDA (total harmonic distortion analysis) method is known for evaluating the response signal. Within the scope of such a method, it is conventional to perform a Fast Fourier Transform (FFT) in order to estimate an amplitude of harmonic noise in the electrochemical reactor and thereby be able to make a statement about the state of the electrochemical state. However, this process is disadvantageous in that this does not allow a sufficient distinction to be made between noise, which may be caused by valves in the electrochemical reactor, for example, and a response signal generated by an application. The FFT is unable to distinguish between such noise and response signals. Noise causes additional peaks or signal peaks and distortions in a frequency spectrum. Now, if response signals are located in a frequency range that is distorted by noise, the amplitudes of the noise and of the response signals are superimposed. It is not possible to distinguish whether an estimated amplitude at a defined frequency point originates from the noise or from the response signal. Consequently, inaccuracies in the signal analysis can lead to correspondingly inaccurate statements in respect of the state of the electrochemical reactor.

An object of the present invention is to at least partly account for the above-described problems. In particular, it is an object of the invention to develop a method, a diagnostic system, a computer program product, and a storage means for ascertaining the state of an electrochemical reactor in particularly reliable fashion as accurately as possible.

The above-described object is achieved by the patent claims. In particular, the above-described object is achieved by the method as claimed in claim 1, the diagnostic system as claimed in claim 10, the computer program product as claimed in claim 12, and the storage means as claimed in claim 13. Further advantages of the invention arise from the dependent claims, the description, and the drawings. Here, features and details described in conjunction with the method for ascertaining the state of the electrochemical reactor naturally also apply in conjunction with the diagnostic system according to the invention, and vice versa in each case, and so, in respect of the disclosure, reciprocal reference is made or can be made to the individual aspects of the invention.

SUMMARY OF THE INVENTION

According to a first aspect of the present invention, a method is provided for ascertaining the state of an electrochemical reactor. The method includes the following steps:
operating an electrode section of the electrochemical reactor for the purposes of generating a harmonic current and/or voltage signal by the electrode section, and
making a model-based estimate of amplitude and/or phase of the harmonic current and/or voltage signal, the state of the electrochemical reactor being ascertained on the basis of the estimate,
wherein a recursive, time series-based method is used to estimate amplitude and/or phase of the harmonic current and/or voltage signal.

That is to say, the FFT for estimating amplitude and/or phase, previously conventional, has been abandoned for the first time according to the invention. Instead of using the FFT, a fundamentally novel path is taken by way of the recursive, time series-based method. This allows signal evaluations to be applied to changing signals, which have a different origin to the applied signals. Recursive, time series-based methods are furthermore particularly advantageous for presently preferred online methods as, in contrast to FFT, they require no so-called windowing, which causes delays.

A recursive, time series-based method allows a disturbance signal to be isolated, as a result of which a more accurate and detailed analysis of the periodic or harmonic current and/or voltage signal and hence a correspondingly improved state analysis for the electrochemical reactor are facilitated in turn. The generated periodic or harmonic current and/or voltage signal is an excitation response. Particularly preferably, the method according to the invention is used for model-based estimation of an amplitude and a phase of harmonic current and voltage signals.

For an example for the use of the method according to the invention, it is noted that this renders it possible to ascertain whether an electrochemical reactor with an electrolyte with the same functional principle as Nafion is in a dry or flooded state and/or whether media depletion such as fuel depletion can be identified.

In the present case, a recursive method should be understood to mean a constructive and/or constantly updating method. The update is preferably implemented after or with each new measured value, which may represent an intermediate value and which is ascertained on the basis of the current and/or voltage signal. Accordingly, the time series-based method is a dynamic method. Unlike in the case of FFT, for example, where an estimate is only provided at the end of a value series of, e.g., 2048 values, a recursive method according to the invention is updated after or with each new measured value, as described above. Thus, the method according to the invention is suitable for processing measured data online, i.e., in this context, without delay and without averaging over a time duration of a measurement window. Since the method according to the invention operates on recursive principles, a current value is estimated on the basis of preceding values; as it were, the recursive method carries out an extrapolation. However, it is also possible as a matter of principle to process data off-line using the method according to the invention.

The recursive time series-based method is preferably performed by means of a linear mathematical model. The linear mathematical model describes the response signal consisting of superposed harmonic fundamental signals. In principle, the linear mathematical model can be found for all technical systems, at least in a range about a defined work point. As a result, it is possible to quickly and easily obtain the required data for estimating the amplitude and/or the phase of the harmonic current and voltage signal. Consequently, the model-based estimate can be understood to be a mathematical estimate, in particular an estimate using the linear mathematical model.

The ascertainment of the state is performed as a signal-based diagnostic method. In particular, observer-based estimation methods are used for the recursive, time series-based method. These have led to particularly accurate analysis data during comprehensive trials within the scope of the present invention. The electrode section should preferably be understood to mean a fuel cell stack with an anode section and a cathode section. For the purposes of generating the current and/or voltage signal with harmonic signal components (response signal), an electrode section can be excited by electrical mixed signals (either current or voltage mixed signal). The mixed signal is composed of a DC component and an AC component. The AC component of the current or voltage excitation is composed of one or more periodic signals, which need not necessarily be sinusoidal. However, periodic excitation can also be implemented in any other way, for example by sonic excitation. In principle, it is irrelevant whether the applied signal relates to an excitation that is applied in predefined fashion or by the operating surroundings. In principle, it is also not necessary for the excitation pattern to be known or invariant over time since the method can be extended by the use of the FFT algorithm. As a result of the excitation, a corresponding voltage and current signal is obtained with amplitudes of harmonic functions with correspondingly specified frequencies.

In particular, the method according to the invention is performed to estimate the amplitude of noise in an electrochemical reactor. Determining the state can be understood to mean a determination of the operational state and/or of health or aging state of the electrochemical reactor. In particular, the method is used for electrochemical reactors such as fuel cells, batteries or electrolyzers.

Moreover, reference should be made to the fact that the application of recursive, time series-based methods for filtering out disturbance signals is known per se in the field of electrochemical reactors. However, the signals filtered with the aid of such methods have never been used as the measurement result, as proposed according to the invention. And it is only this that facilitates a particularly precise estimation of amplitude and/or phase of the harmonic current and/or voltage response, as a result of which the state of the electrochemical reactor can be ascertained, in turn, with corresponding accuracy.

According to a development of the present invention, it is possible for the recursive, time series-based method to include Kalman filtering. That is to say, a Kalman filter is used or Kalman filtering is performed for the purposes of estimating the amplitude and/or phase of the harmonic current and voltage signal. Particularly accurate analysis results in respect of the estimate when Kalman filtering is used could be determined in trials within the scope of the present invention. Kalman filtering allows dynamic variables in the electrochemical reactor such as for example pressure, temperature or speed, in particular, to be ascertained reliably. To this end, signal components of a measured signal (these are harmonic functions) are estimated by the method according to the invention. A state in the reactor (such as, e.g., drying, flooding and/or fuel depletion) and/or other variables as well can be deduced on the basis of the harmonic components by way of certain relationships. Kalman filtering can also be used for ascertaining parameters if dynamic models are introduced for the development of parameters over time. When using Kalman filtering, the measuring results obtained by the Kalman filtering and a process noise covariance matrix are preferably used to adapt (tune) the filtering or to improve the latter. This facilitates an increased degree of freedom when tuning parameters, as a result of which, in turn, individual weighting of each individual harmonic estimate is made possible. Further, the Kalman filtering can be parameterized in order to better filter out an unknown noise in the current and/or voltage signal.

Further, it is possible in a method according to the invention for the recursive, time series-based method to include a plurality of instances of Kalman filtering running in parallel. Comprehensive trials have shown that this can increase the accuracy of the estimate, as a result of which the increased complexity in respect of the parallel method of operation is justified. Here, a plurality of Kalman filters with different properties are preferably initialized.

Moreover, in a method according to the present invention, it is possible for the recursive, time series-based method to include an RLS method. That is to say, an RLS method is used or performed for estimating amplitude and/or phase of the harmonic current and voltage signal. An RLS method should be understood to mean a recursive least-squares method or a method using a recursive least-squares algorithm. When using the RLS method, trials within the scope of the present invention have also allowed particularly accurate analysis results to be determined in respect of the estimate. For the purposes of tuning the parameter and/or algorithm in the RLS method, use is preferably made of only a single scalar or forgetting factor. Thus, preferably only one single (easily interpretable) tuning parameter allows fast tuning for disturbance-free measurements. However, as a result of the fewer degrees of freedom, it may be the case that, in general, the response signal cannot be extracted, at least in a simple fashion, in a disturbed case.

According to a further method variant of the present invention, a measurement setup is used for ascertaining the state and the background noise of the measurement setup during the estimate is set to be above −80 dBV. Particularly preferably, a measurement setup whose background noise, where possible, is less than −60 dBV during the estimation is used for ascertaining the state. The limit of −80 dBV was found to be sufficiently low to obtain meaningful results but nevertheless does not require too much outlay or too high costs in respect of the measurement setup.

Further, it may be advantageous if, during a method according to the invention, a Fast Fourier Transform is performed at least intermittently during the estimate for the purposes of localizing frequency ranges in which the estimate is made. Within the scope of the invention, at least intermittently is understood to mean at least at periodic intervals, in particular. However, estimating can advantageously also be performed continuously. The complementary FFT allows the estimate to be performed in targeted fashion and accordingly in meaningful fashion as a result.

Further, the complementary FFT leads to an advantageous update of known frequencies. This is an advantageous compromise between the use of extended filters and complex nonlinear models in the case of unknown initial frequencies. If the excitation frequencies are known, a linear model suffices for an accurate estimate. Such a linear model only requires little computational outlay. However, if the excitation frequencies are unknown or subject to a so-called "drift", this now varying frequency leads to a nonlinear model. As a result, simultaneous estimate of amplitude, phase and frequency in one step is only still possible by way of, e.g., extended Kalman filters (or other nonlinear estimation methods); however, this is accompanied by increased computational outlay and no longer online capable under certain circumstances.

It is advantageous if a residual signal component is evaluated further after amplitude and/or phase of the harmonic current and/or voltage signal has been estimated. Following the determination of the specified harmonic components by the recursive, time series-based method (e.g. RLS or KF method), another or residual signal component may still remain. The latter then is subject to further evaluation in order to derive additional information about the operating state.

Moreover, it may be advantageous if the state is ascertained within the scope of an online diagnostic method. By way of example, the electrochemical reactor is configured in the form of a fuel cell system, in particular a PEM fuel cell system or a low temperature fuel cell system. That is to say, according to the invention, the state of a fuel cell system can be ascertained accordingly. Moreover, the electrochemical reactor may also be embodied as an electrolyzer or as a battery.

A diagnostic system for ascertaining the state of an electrochemical reactor is proposed according to a further aspect of the present invention. The diagnostic system comprises an estimation apparatus for making a model-based estimate of amplitude and/or phase of a harmonic current and/or voltage signal of an electrode section of the electrochemical reactor for ascertaining the state of the electrochemical reactor, wherein the estimation apparatus is configured to estimate amplitude and/or phase of the harmonic current and/or voltage signal and embodied to use a recursive, time series-based method. Consequently, a diagnostic system according to the invention has the same advantages as are described in detail with reference to the method according to the invention.

Moreover, a diagnostic system according to the invention could be configured and embodied to ascertain the state as per a method as described in detail above. This allows the estimation apparatus to be configured and embodied to apply Kalman filtering as described above and/or an RLS method.

Furthermore, a computer program product is proposed according to the invention, said computer program product being stored on a storage means and being configured and embodied to perform a method as described above. Moreover, a storage means is provided, on which such a computer program product is stored. Accordingly, the computer program product according to the invention and the storage means likewise are accompanied by the advantages presented above.

The computer program product can be implemented as a computer readable instruction code in any suitable programming language such as for example in Java or C++. The computer program product can be stored on the computer readable storage means such as a data disk, a removable drive, a volatile or non-volatile memory, or an installed memory/processor. The instruction code can program a computer or other programmable devices, such as a controller of the diagnostic system, in such a way that the desired functions are carried out. Further, the computer program product can be provided on a network, for example the Internet, from where a user can download it as necessary. The computer program product can be realized both by means of a computer program, i.e., software, and by means of one or more specific electronic circuits, i.e., in hardware, or in any hybrid form, i.e., by means of software components and hardware components.

BRIEF DESCRIPTION OF THE SEVERAL VIEWS OF THE DRAWINGS

Further measures that improve the invention arise from the following description of various exemplary embodiments of the invention, which are schematically illustrated in the figures. All features and/or advantages emerging from the claims, the description or the drawing, including structural details and spatial arrangements, can be essential to the invention, both on their own and in the various combinations.

Respectively schematically.

DESCRIPTION OF SPECIFIC EMBODIMENTS OF THE INVENTION

Figure 1:
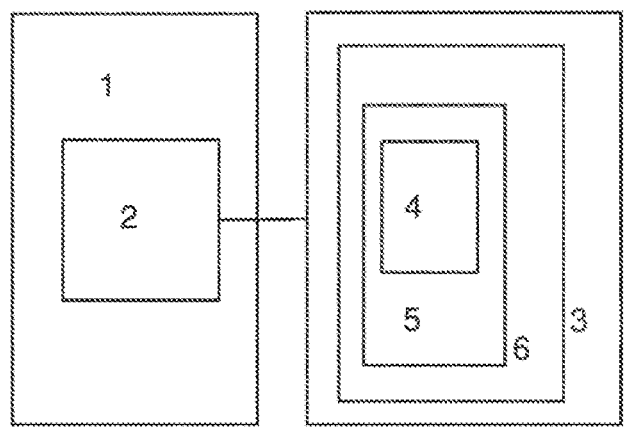
FIG. 1 shows a block diagram for explaining a diagnostic system according to the invention.

FIG. 1 schematically illustrates, in the form of a block diagram, a diagnostic system 3 according to the invention for ascertaining the state of an electrochemical reactor 1. The diagnostic system 3 comprises an estimation apparatus 4 for making a model-based estimate of amplitude and/or phase of a harmonic current and voltage signal of an electrode section 2 of the electrochemical reactor 1 for ascertaining the state of the electrochemical reactor 1, wherein the estimation apparatus is configured to estimate amplitude and/or phase of the harmonic current and voltage signal and embodied to use a recursive, time series-based method. The electrochemical reactor 1 illustrated in FIG. 1 should be embodied in the form of a cell stack (e.g., a battery stack), which may be a constituent part of a mobile application for example.

Further, the diagnostic system 3 illustrated in FIG. 1 comprises a storage means 6 with a computer program product 5 stored thereon. The computer program product is configured and embodied to perform a method as described in detail below.

Figure 2:
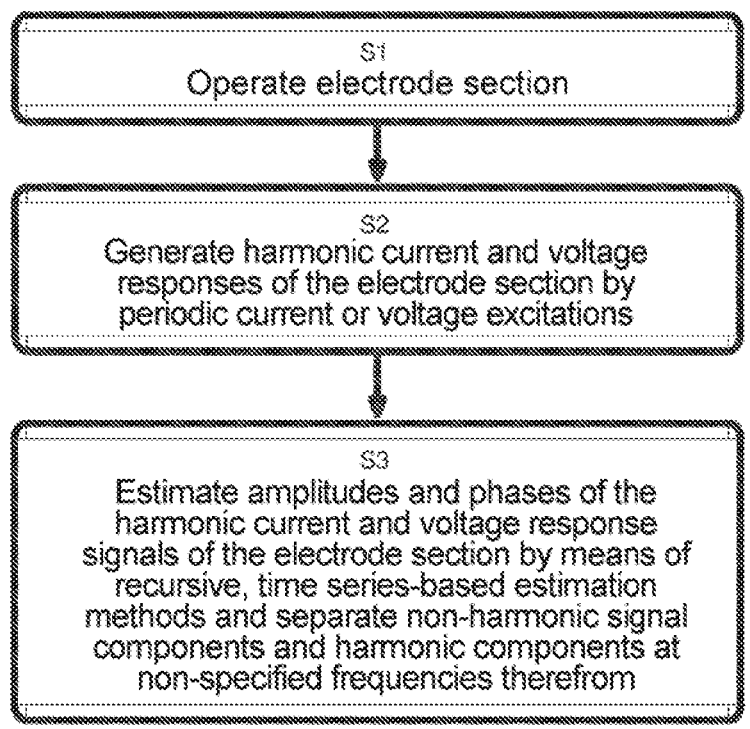
FIG. 2 shows a flowchart for explaining a method as per an embodiment according to the invention.

Now, a method for ascertaining the state of the electrochemical reactor 1 is explained with reference to the flowchart illustrated in FIG. 2. In a first step S1, the electrode section 2 of the electrochemical reactor 1 is initially operated while a harmonic current signal or voltage signal is applied thereto. In a second step S2, the application of current or voltage leads to the generation of a correspondingly harmonic voltage or current signal by the electrode section 2 (response signal). Subsequently, a model-based estimate of amplitude and phase of the harmonic current or voltage signal or of the response signal is performed in a third step S3, wherein the state of the electrochemical reactor 1 is ascertained on the basis of the estimate. A recursive, time series-based method is used for the purposes of estimating amplitude and phase of the harmonic current and voltage signal. This method is applied if the frequencies of the external excitation are known. Here, the response behavior of the electrode section 2 is static. The frequencies of the relevant harmonic signals are known.

To ascertain the state, a measurement setup is used, with the background noise of the measurement setup being set to above −80 dBV during the estimate. The state is ascertained within the scope of an online diagnostic method.

Figure 3:
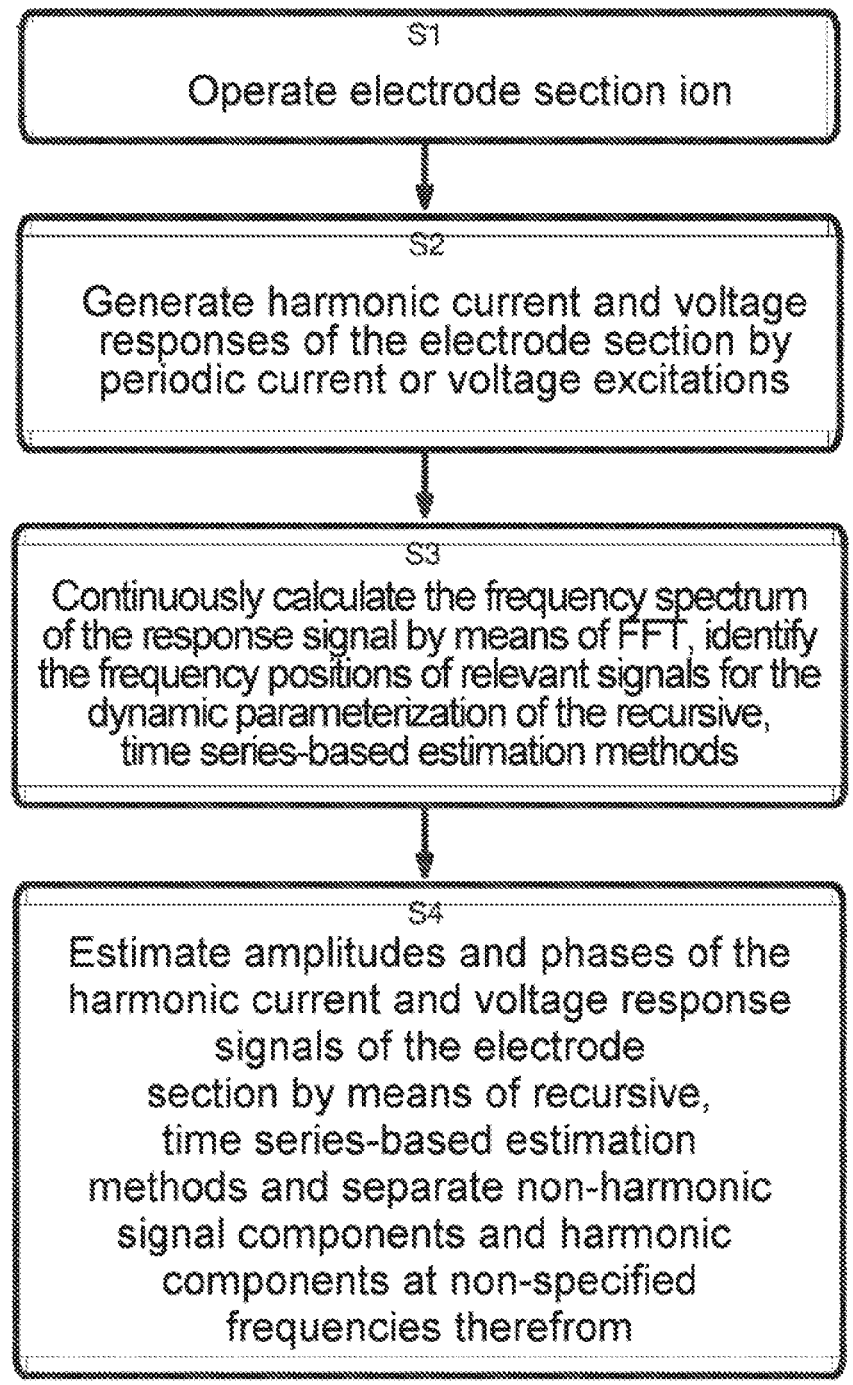
FIG. 3 shows a flowchart for explaining a method as per an embodiment according to the invention for systems with an unknown or temporally changing excitation.

In a further manifestation of the estimation device, an FFT algorithm is combined with the recursive, time series-based method. This is shown in FIG. 3. Here, the electrode section 2 is also excited with unknown or changeable frequencies in addition to the known excitation frequencies. In their conventional embodiments, the proposed recursive filtering methods contain no analysis of the current frequency spectrum of the signal to be examined. However, the frequencies of the harmonic components to be evaluated must be entered during the parameterization of the filter; this is easily possible in the case of known excitation frequencies and a known typical response characteristic. However, if there is a change in the frequencies of the application and/or of the response signal, the respective frequency spectrum must be ascertained online. The online calculation of the frequency spectrum by means of FFT is not a quantitative calculation of the respective amplitude levels (which is susceptible to errors), but an ascertainment of the frequencies of frequency-drifting signal components (harmonic signal components)—which are important for monitoring the state of the electrochemical reactor 1. In this case, it is necessary to continuously ascertain the frequency positions of the signals for the purposes of parameterizing the amplitude and phase estimate.

Figure 4:
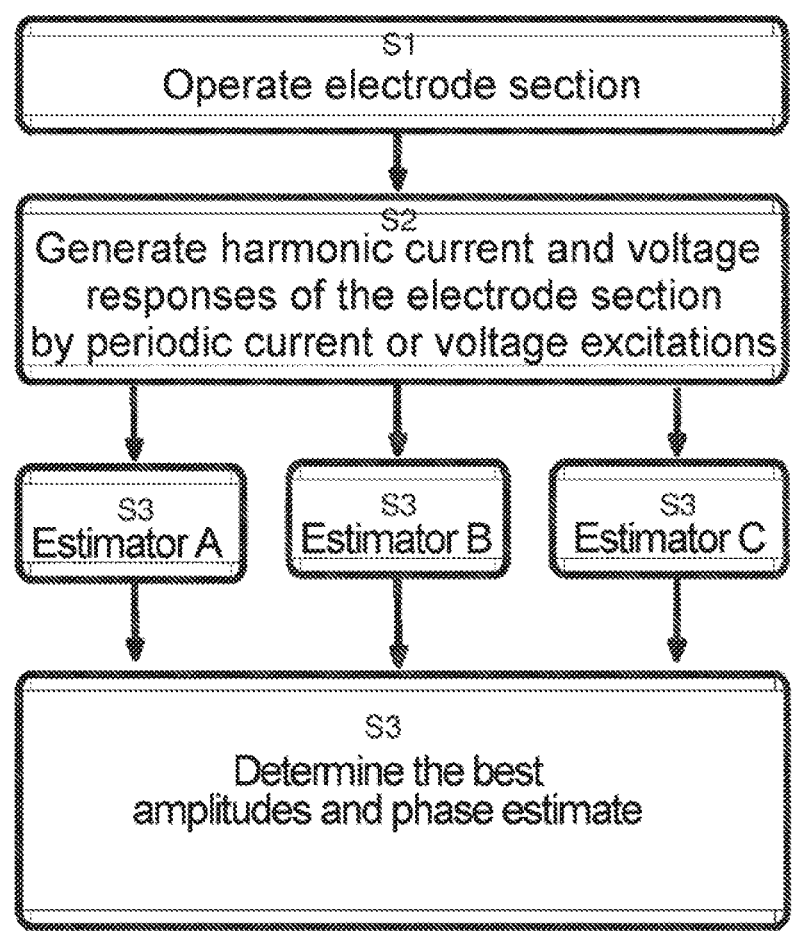
FIG. 4 shows a flowchart for explaining a method as per an embodiment according to the invention for systems with variable or changeable, very dynamic response behavior.

FIG. 4 shows a further application with a very dynamic behavior of the relevant amplitudes and phases, with the phases and amplitudes being estimated in parallel with differently configured estimators.

Both Kalman filtering and an RLS method are known as such in the prior art as a matter of principle and should therefore not be described in comprehensive form so as to avoid unnecessary explanations. Therefore, only selected examples of method sections of Kalman filtering and an RLS method are presented below.

Application of an RLS method:
Signal is Estimated on the Basis of a Sum of Harmonic Signals $$y(k) = \sum_{n=1}^{N} A_n \cos(\omega_N k \Delta t) + \sum_{n=1}^{N} B_n \sin(\omega_N k \Delta t) + \delta(k \Delta t) \tag{1}$$

$$\begin{bmatrix} y(1) \\ y(2) \\ \vdots \end{bmatrix} = \begin{bmatrix} \cos(\omega_1 1 \Delta t) & \sin(\omega_1 1 \Delta t) & \cos(\omega_1 1 \Delta t) & \sin(\omega_1 1 \Delta t) & \ldots & 1 \\ \cos(\omega_1 2 \Delta t) & \sin(\omega_1 2 \Delta t) & \cos(\omega_1 2 \Delta t) & \sin(\omega_1 2 \Delta t) & \ldots & 1 \\ \vdots & & & & & \end{bmatrix}_{B} \begin{bmatrix} A_1 \\ B_1 \\ A_2 \\ B_2 \\ \vdots \\ \delta \end{bmatrix} \tag{2}$$

$$\hat{\Theta} = (X^T X)^{-1} X^T \underline{y}$$

$$Amp_{ss} = \sqrt{A_n^2 + B_n^2} \tag{3}$$

$$Phase_n = \operatorname{atan}\left(\frac{B_n}{A_n}\right) \tag{4}$$

Partitioning of Regressor Matrix and Signal Vector for New Value at Time k+1

$$\underline{y}(k+1) = \begin{bmatrix} \underline{y}(k) \\ y(k+1) \end{bmatrix}, \tag{5}$$

$$X(k+1) = \begin{bmatrix} X(k) \\ \underline{x}^T(k+1) \end{bmatrix}$$

Development to a Recursive Variant of the Least Square Estimation $$\hat{\Theta}(k+1) = \tag{6}$$
$$\hat{\Theta}(k) + \frac{P(k) \cdot \underline{x}(k+1)}{\lambda + \underline{x}^T(k+1) \cdot P(k) \cdot \underline{x}(k+1)} \cdot \left(y(k+1) - \underline{x}^T(k+1) \cdot \hat{\Theta}(k)\right)$$

$$P(k+1) = \frac{1}{\lambda} \cdot (P(k) - \underline{\gamma}(k) \cdot \underline{x}^T(k+1) \cdot P(k)) \tag{7}$$

Here, the scaler λ is used to weight the importance of new data over the old data, i.e., to tune or increase the reaction capability.

Application of Kalman Filtering:

In the present example, there is a dynamic model with unknown parameters, with the assumption being made that the parameters only change slowly and with stochastic process noise (w(k)) being present. The stochastic process noise allows the time-variant estimation of the parameters. Consequently, the noise process as per (8) is essential.

$$\hat{\theta}(k+1) = \hat{\theta}(k) + w(k), \tag{8}$$

In addition to the covariance of the measurement noise, the covariance matrix of the process noise is a tuning parameter of the Kalman filter.

$$E\{w(k)^T w(k)\} = Q \tag{9}$$

Here, $E\{w(k)^T w(k)\}$ is the expected value and Q is the covariance matrix of the process noise.

$$\hat{y}(k+1) = \underbrace{[\cos(\omega_1 \Delta t(k+1))\sin(\omega_1 1\Delta t(k+1))\ldots 1]}_{H(k+1)} \hat{\Theta}(k+1) \quad (10)$$

$$\hat{\Theta}(k+1) = \hat{\Theta}(k) + K(k+1)(y(k+1) - H(k+1)\hat{\Theta}(k+1)) \quad (11)$$

The scheme is similar to that of the RLS method presented above, with the Kalman filter gain being determined using the covariance of process and measurement noise, which is used as a tuning parameter. However, equation (1) has been expanded by a (linear) disturbance term, as a result of which filtering of noise is rendered possible. The process noise is essential to the Kalman filter since the covariance of the assumed process noise is the decisive tuning parameter which, inter alia, also facilitates the isolation of disturbance and response signal. The additional degrees of freedom when tuning the Kalman filter allow the calibration and weighting of response and disturbance signals.

Figure 5A:
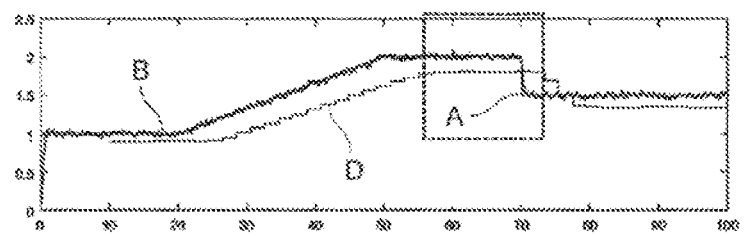
FIG. 5a shows a diagram for explaining the difference in the quality of the measurement, in disturbed test surroundings, between an estimate according to the invention and an estimate by means of FFT.
Figure 5B:
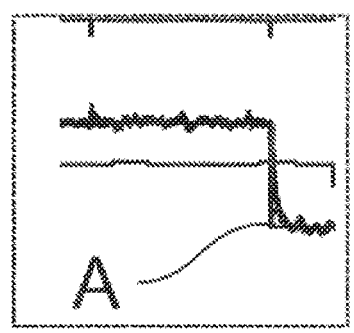
FIG. 5b shows an excerpt of FIG. 5a, FIG. 6 shows a further diagram for explaining the difference in the quality of the measurement, in disturbed test surroundings, between an estimate according to the invention and an estimate by means of FFT.
Figure 6:
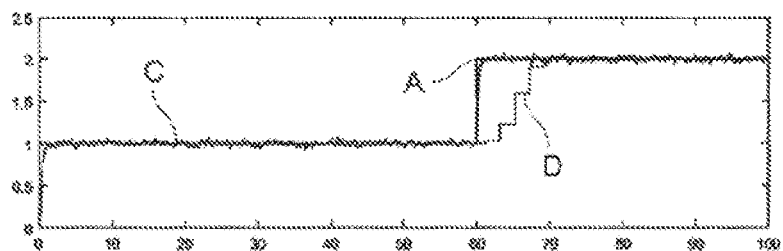

The difference between an estimate B of a harmonic amplitude A by means of Kalman filtering and an estimate D using an FFT is illustrated with reference to FIGS. 5a, 5b and 6. In the illustrated diagram, the amplitude is plotted over time in seconds. As is evident from the diagram in FIGS. 5a and 5b (FIG. 5b shows an excerpt of FIG. 5a), the estimate B using the Kalman filter is significantly closer to the actual signal of the harmonic amplitude A than the estimate D using an FFT. FIGS. 5a and 5b exhibit an inherent estimation bias (leakage effect) of the FFT, which is prevented by Kalman filtering. In contrast thereto, there is no leakage effect in the FFT in the example as per FIG. 4 as the excitation frequency coincides with a frequency grid point of the FFT. However, this was artificially generated in the example of FIG. 6; in practice, the occurrence of such a case is very improbable. Once again, the faster convergence of the Kalman filtering in relation to the FFT is evident.

Figure 7A:
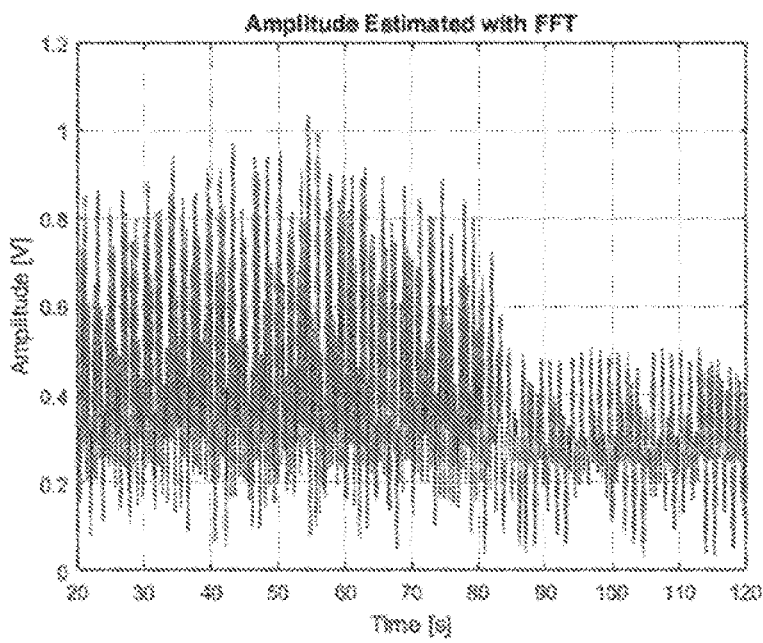
FIGS. 7a and 7b show diagrams for explaining the difference between an estimate of a harmonic according to the invention and an estimate by means of FFT.
Figure 7B:
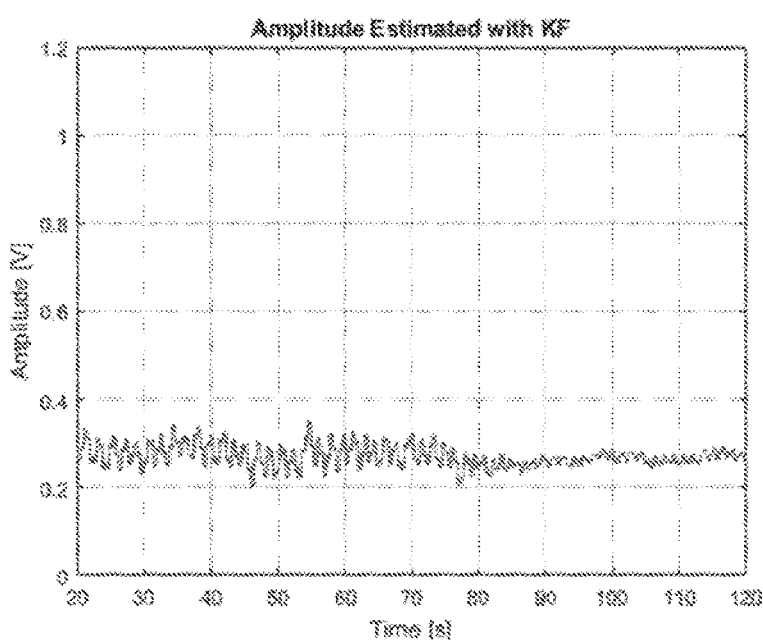

FIGS. 7a and 7b show the power of the novel process by means of Kalman filtering (FIG. 7b) in comparison with the known, pure FFT process (FIG. 7a) in rough surroundings, wherein the disturbance signal has been isolated.

In addition to the illustrated embodiments, the invention admits further design principles. That is to say, the invention should not be construed as being constricted to the illustrated embodiments.

LIST OF REFERENCE SIGNS

1 Electrochemical reactor
2 Electrode section
3 Diagnostic system
4 Estimation apparatus
5 Computer program product
6 Storage means
A Actual signal
B Estimate using an RLS method
C Estimate using Kalman filtering
D Estimate using an FFT

The invention claimed is:

1. A signal-based diagnostic method for ascertaining the state of an electrochemical reactor, including the steps of:
operating an electrode section of the electrochemical reactor for the purposes of generating and applying to the electrochemical reactor a harmonic current and/or voltage signal by the electrode section, and
model-based estimating of amplitude and/or phase of a measured response signal corresponding to the applied harmonic current and/or voltage signal-, the state of the electrochemical reactor (1) being a dry or flooded state and/or a media depletion ascertained on the basis of the estimate,
wherein a recursive, time series-based method is used to estimate amplitude and/or phase of the harmonic current and/or voltage of the response signal, and to evaluate changing signals having a different origin to the applied signals,
wherein the recursive, time series-based method is performed by means of a linear mathematical model describing the response signal consisting of superposed harmonic fundamental signals;
wherein the recursive, time series-based method implements a constructive and/or constantly update after or with each new measured value and a filtering of disturbance signals;
wherein signals filtered by the recursive, time series-based method are used as measurement results for the estimation of amplitude and/or phase of the harmonic current and/or voltage of the response signal.

2. The method as claimed in claim 1, wherein the recursive, time series-based method includes Kalman filtering.

3. The method as claimed in claim 1, wherein the recursive, time series-based method includes a plurality of instances of Kalman filtering running in parallel.

4. The method as claimed in claim 1, wherein the recursive, time series-based method includes an RLS method.

5. The method as claimed in claim 1, wherein a measurement setup is used for ascertaining the state and the background noise of the measurement setup during the estimate is set to be above −80 dBV.

6. The method as claimed in claim 1, wherein a Fast Fourier Transform (FFT) is performed at least intermittently during the estimate for the purposes of localizing frequency ranges in which the estimate is made.

7. The method as claimed in claim 1, wherein the state is ascertained within the scope of an online diagnostic method.

8. The method as claimed in claim 1, wherein a residual signal component is evaluated further after amplitude and/or phase of the harmonic current and/or voltage signal has been estimated.

9. The method as claimed in claim 1, wherein the electrochemical reactor is a fuel cell system, more particularly a PEM fuel cell system.

10. A diagnostic system for ascertaining the state of an electrochemical reactor, comprising:
an estimation apparatus for making a model-based estimate of amplitude and/or phase of a harmonic current and/or voltage signal of an electrode section of the electrochemical reactor for ascertaining the state of the electrochemical reactor,
wherein the estimation apparatus having a computer processor adapted to perform steps of a method as claimed in claim 1 for estimating the amplitude and/or phase of the harmonic current and/or the voltage signal.

11. A diagnostic system, configured and embodied to ascertain the state as per a method as claimed in claim 1.

12. A non-transitory computer readable medium containing computer instructions stored therein for causing a computer processor to perform steps of a method as claimed in claim 1.

* * * * *